US 6,700,396 B1

(12) United States Patent
Smith et al.

(10) Patent No.: US 6,700,396 B1
(45) Date of Patent: Mar. 2, 2004

(54) INTEGRATED MICROMACHINE RELAY FOR AUTOMATED TEST EQUIPMENT APPLICATIONS

(75) Inventors: Stephen W. Smith, San Jose, CA (US); William R. Creek, Fremont, CA (US)

(73) Assignee: LTX Corporation, Westwood, MA (US)

( * ) Notice: Subject to any disclaimer, the term of this patent is extended or adjusted under 35 U.S.C. 154(b) by 0 days.

(21) Appl. No.: 09/859,842

(22) Filed: May 16, 2001

(51) Int. Cl.[7] .............................................. G01R 31/02
(52) U.S. Cl. ....................................... 324/754; 324/755
(58) Field of Search ................................. 324/754, 755, 324/757, 758, 761, 765, 158.1; 235/451, 492

(56) References Cited

U.S. PATENT DOCUMENTS

| | | | |
|---|---|---|---|
| 3,609,991 A | | 10/1971 | Chu et al. |
| 3,714,572 A | * | 1/1973 | Ham et al. ............... 324/758 |
| 3,882,691 A | | 5/1975 | Baines et al. |
| 3,946,276 A | | 3/1976 | Braun et al. |
| 4,044,396 A | | 8/1977 | Haws et al. |
| 4,104,700 A | | 8/1978 | Hutchison et al. |
| 4,109,707 A | | 8/1978 | Wilson et al. |
| 4,138,643 A | * | 2/1979 | Beck et al. ............... 324/754 |
| 4,399,484 A | | 8/1983 | Mayer |
| 4,698,728 A | | 10/1987 | Tustaniwskyj et al. |
| 4,721,996 A | | 1/1988 | Tustaniwskyj et al. |
| 4,782,290 A | | 11/1988 | Sakai et al. |
| 4,791,983 A | | 12/1988 | Nicol et al. |
| 4,809,134 A | | 2/1989 | Tustaniwskyj et al. |
| 4,860,164 A | | 8/1989 | Kaufman |
| 4,865,123 A | | 9/1989 | Kawashima et al. |
| 4,879,629 A | | 11/1989 | Tustaniwskyj et al. |
| 4,938,279 A | | 7/1990 | Betker |
| 4,989,070 A | | 1/1991 | Iversen et al. |
| 5,048,599 A | | 9/1991 | Tustaniwskyj et al. |
| 5,166,863 A | | 11/1992 | Shmunis |
| 5,459,352 A | | 10/1995 | Layton et al. |
| 5,818,246 A | * | 10/1998 | Zhong ....................... 324/754 |
| 5,933,019 A | * | 8/1999 | Depue ....................... 324/761 |
| 6,157,200 A | * | 12/2000 | Okayasu .................... 324/753 |
| 6,208,510 B1 | | 3/2001 | Trudeau et al. |
| 6,449,741 B1 | | 9/2002 | Organ et al. |

OTHER PUBLICATIONS

W. Maly, "Current Testing," IEEE, 1990 International Test Conference, p. 257 (No Month).
S. Bolinger & S Midkiff, "On Test Generation for Iddq Testing of Bridging Faults in CMOS Circuits," IEEE, 1991 International Test Conference, pp. 598–607 (No Month).
E. Vandris & G. Sobelman, "A Mixed Functional/Iddq Testing Methodology for CMOS Transistor Faults," IEEE, 1991 International Test Conference, pp. 608–614 (No Month).
C. Chen & J. Abraham, "High Quality Tests For Switch–Level Circuits Using Current and Logic Test Generation Algorithms," IEEE, 1991 International Test Conference, pp. 615–622 (No Month).

(List continued on next page.)

Primary Examiner—Ernest Karlsen
Assistant Examiner—Russell M. Kobert
(74) Attorney, Agent, or Firm—Blakely, Sokoloff, Taylor & Zafman LLP

(57) ABSTRACT

A method and apparatus for a micromachine relay is provided. A pin controller comprises at least one spring pin designed to movably couple the pin controller to a device under test (DUT) to provide signals to the DUT. The pin controller further includes a micromachine relay coupled to the at least one spring pin to control the movement of the at least one spring pin and an integrated circuit for controlling the micromachine relay.

23 Claims, 14 Drawing Sheets

OTHER PUBLICATIONS

R. Aitken, "Fault Location with Current Monitoring," IEEE, 1991 International Test Conference, pp. 623–632 (No Month).

R. Kapur, J. Park & M. Mercer, "All Tests For A Fault Not Equally Valuable For Defect Detection," IEEE, 1992 International Test Conference, pp. 762–769 (No Month).

R. Gulati, W. Mao & D. Goel, "Detection of 'Undetectable' Faults Using Iddq Testing," IEEE, 1992 International Test Conference, pp. 770–775 (No Month).

R. Aitken, "A Comparison of Defect Models for Fault Location with Iddq Measurements," IEEE, 1992 International Test Conference, pp. 778–787 (No Month).

Y. Muira & K. Kinoshita, "Circuit Design for Built–in Current Testing," IEEE, 1992 International Test Conference, pp. 873–881 (No Month).

R. Rodriguez–Montanes, E.M.J.G. Bruls & J. Figueras, "Bridging Defects Resistance Measurements in a CMOS Process," IEEE, 1992 International Test Conference, pp. 892–899 (No Month).

K. M. Wallquist, A. W. Righter & C. F. Hawkins,"A General Purpose Iddq Measurement Circuit," IEEE, 1993 International Test Conference, pp. 642–651 (No Month).

J. M. Soden, R.R. Fritzmeier & C.F. Hawkins, "Zero Defects or Zero Stuck–At–Faults—CMOS IC Process Improvement, with Iddq," IEEE, 1990 International Test Conference, pp. 255–256 (No Month).

K. Baker & B. Verhelst, "Iddq Testing Because Zero Defects Isn't Enough : A Philips Perspective," IEEE, 1990 International Test Conference, pp. 253–254 (No Month).

S. McEuen, "Why IDDQ?," IEEE, 1990 International Test Conference, p. 252 (No Month).

C. Crapuchettes, "Testing CMOS Idd on Large Devices," IEEE 1987 International Test Conference, pp. 310–315 (No Month).

M. Keating & D. Meyer, "A New Approach To Dynamic Idd Testing," IEEE 1987 International Test Conference, pp. 316–367 (No Month).

L. K. Horning, J.M. Soden, R.R. Fritzemeier & C. Hawkins, "Measurements of Quiescent Power Supply Current for CMOS ICs in Production Testing," IEEE 1987 International Test Conference, pp. 300–309 (No Month).

James T. Healy, "New CMOS Designs Demand Different and Radical Test Approaches," Electronic Test, Reprint, 5 pages (Dec. 1985).

Hank Hogan, "More Than Toys," High Technology Careers Magazine, Feature Presentation, http://careerexpo.com/pub/dox197,micromachine197.html, 3 pages (1996) (Month Unavailable).

"Micromachine Technology," http://www.info.hqs.cae.nt-t.jp/RD/ACT_act_3/micromachine.html, 2pages (prior to May 16, 2001).

LTX MicroMaster *Plus* Brochure (Prior to May 16, 2001) (USA).

LTX ValidMaster *Plus* Brochure (Prior to May 16, 2001) (USA).

General Specifications, Class 388 and 283 Relays, http://magnecraft.com/page29.html, pp. 1–2 (Wednesday, Aug. 27, 1997).

"General Purpose Square Base VDE Approved Relay," http://magnecraft.com/page33.html, pp. 1–2 (Wednesday, Aug. 27, 1997).

LTX "Deltamaster Product Description," No. 999–7741–01–01, pp. 1–40 (LTX Corporation Nov. 1992) (USA).

"Fluorinert Liquid Heat Sink FC–3260," 3M New Product Announcemnet, Jan. 1989.

Charles Wall, "Liquid Heat Sink Controls Computer Heat Flux," Reprinted from Electronic Packaging & Production (Feb. 1989).

Howard W. Markstein, "Liquid Cooling Optimizes Heat Transfer," Electronic Packaging and Production, pp. 46–49 (Apr. 1988).

Richard D. Danielson, Nick Krajewski, and Jerry Brost, "Cooling a Superfast Computer," Electronic Packaging and Production (Jul. 1986).

Ralph Remsburg, "New Routes to Cooler Electronics," Machine Design, pp. 73–76 (Jul. 11, 1991).

"Micromachined Relays," Teledyne Electronics and Communications, 1999. (Month Unavailable).

J. Simon, S. Saffer, F. Sherman, and C.–J Kim, "Lateral Polysilicon Microrelays with a Mercury Micro–Drop Contact," pp. 1–15, 1998. (Month Unavailable).

* cited by examiner

INTEGRATED MICROMACHINE RELAY FOR AUTOMATED TEST EQUIPMENT APPLICATIONS

FIELD OF THE INVENTION

The present invention relates to test equipment, and more specifically, to relays used in test equipment.

BACKGROUND

Electronic devices are often tested using automatic test equipment (ATE). Generally, the tester includes a computer system that coordinates and runs the tests, and a testing apparatus. The testing apparatus includes a test head, into which the device under test (DUT) is placed.

Contacts in the test head are used to couple the trace of the DUT to the control mechanisms. These contacts, generally spring pins, are designed to send through a high fidelity and high speed signal from the computer system. A control circuit and timing generation generally controls access. Pin electronics are electronic components that control the individual pins. The individual pins are controlled by relays, electromagnetic devices for remote and automatic control of the pins. The relays are actuated by variation in conditions of an electric circuit controlled by the pin electronics integrated circuits. Relays are mechanical devices that are large in size, especially with respect to the other components on the test head. Reducing the size of the relays may result in the need for more complex control circuits. However, the size of the components that may be placed on a test head is limited.

Alternatively, electronic switches may be used in place of the relays in order to control the pins. However, electronic switches either have low bandwidth or high resistance when they are on, or low breakdown voltage and high leakage current when they are off. Transistors are disadvantageous, as they do not have a suitable combination of through bandwidth, on resistance, and breakdown voltage.

SUMMARY AND OBJECTS OF THE INVENTION

It is an object of this invention to provide for automatic test equipment that utilizes a micromachine relay for controlling pins.

It is a further object of this invention to reduce the electric length from the device under test (DUT) to the pin electronics.

A pin controller is described. A pin controller comprises at least one spring pin designed to movably couple the pin controller to a device under test (DUT) to provide signals to the DUT. The pin controller further includes a micromachine relay coupled to the at least one spring pin to control the movement of the at least one spring pin and an integrated circuit for controlling the micromachine relay.

Other objects, features, and advantages of the present invention will be apparent from the accompanying drawings and from the detailed description that follows below.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A method and apparatus for using a micromachine relay in an automated test system is described. Using a micromachine relay in automated testing equipment reduces an electrical length between the pin electronics and the device under test (DUT). The micromachine relay could further be integrated onto the pin electronics integrated circuit (IC). The features of this design include a shorter electrical length between the device under test (DUT) and the pin electronics, increased bandwidth, and higher pin count by reducing associated control sizing.

Using micromachined relays further provides a lower fabrication cost. Furthermore, the pin electronics device may be mounted directly below the spring pin ring, since the reduction in size provides additional space. The use of micromachine relays also permits use of the system for mixed signal testing. Furthermore, because the pin electronics are close to the center, there is a shorter electrical length, leading to better signals. However, using the relay and the pin electronics in close proximity creates a need for integrated cooling. Therefore, for one embodiment, a cooling mechanism is integrated into the integrated circuit card, as will be described below.

Figure 1:
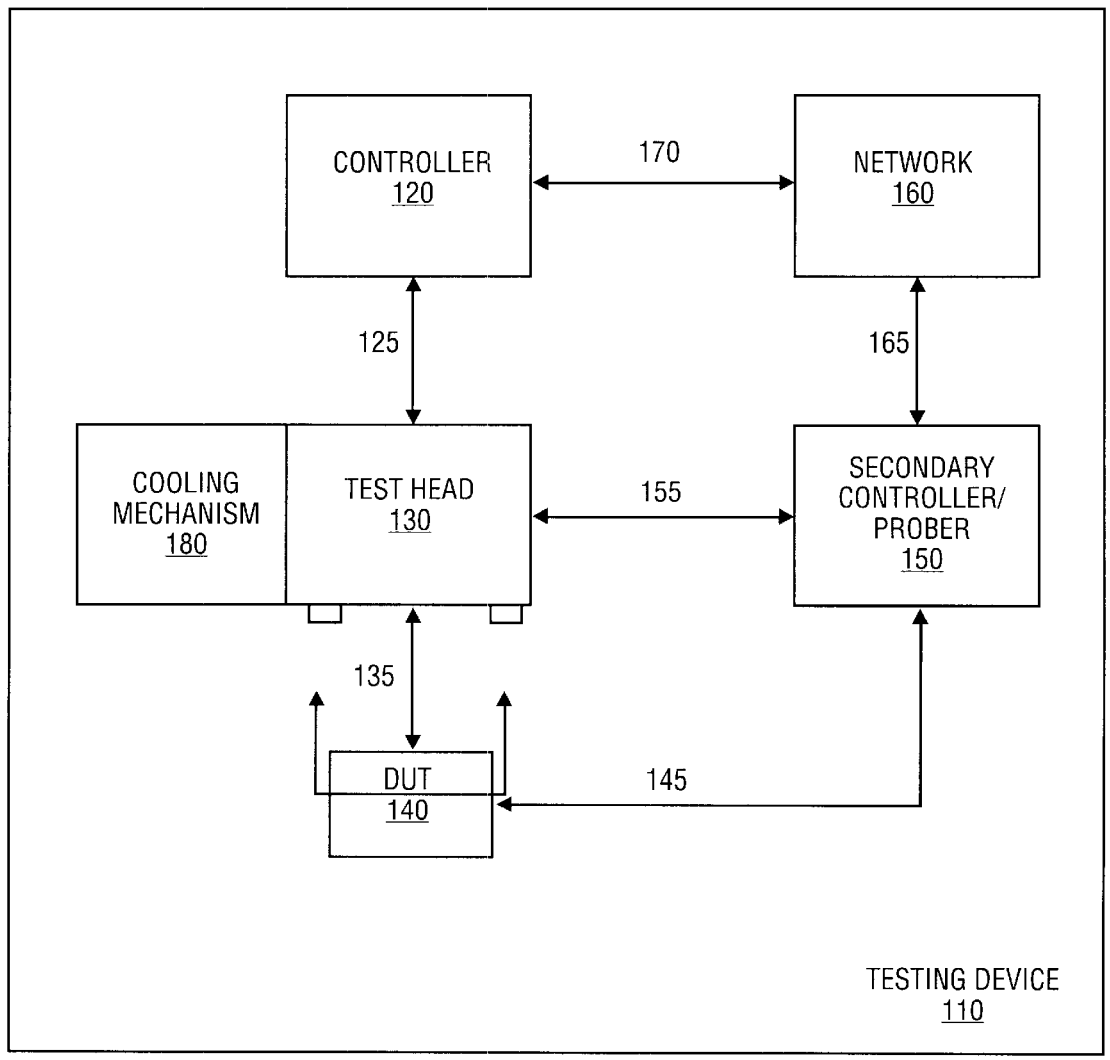
FIG. 1 illustrates an overview block diagram of one embodiment of a testing system in which the present invention may be implemented.

FIG. 1 illustrates an overall block diagram of one embodiment of the testing device 110 in which the present invention may be included. The testing device 110 includes a computer system 120. For one embodiment, the computer system 120 includes at least one central processing unit (CPU). For one embodiment, the computer system 120 may be a mainframe.

The computer system 120 is coupled via transmission lines 125 to a test head 130. The transmission lines 125, for one embodiment, comprise a bus. The test head 130 is designed to test a device under test (DUT) 140 that is coupled to the test head 130 via connectors 135. The connectors 135 may comprise a set of pins within the test head 130. For one embodiment, the connection 135 may be spring pins, an elastomeric connection, a bump connector, or another type of connector. The micromachine relays, discussed in more detail below, are used to couple and decouple the DUT 140 from the test head 130. For one embodiment, the connectors 135 may be rigid, and an electric coupling may be established. For another embodiment, the connectors 135 may be moveable, such as moveable springs or micromachine bump connectors. If the connections 135 are micromachine bump connectors, for one embodiment, electrostatic force may be used to move the bump, and thereby establish a connection between the DUT 140 and the test head 130. For simplicity, for the remainder of this application the term "spring pin" will be used. However, it is to be understood that the term "spring pin" may refer to any connector 135 which is used to couple the DUT 140 to a test head 130, including a spring pin, an elastomer, a bump connector, or another type of connection.

An integral cooling mechanism 180 may be coupled to test head 130. For one embodiment, integral cooling mechanism 180 may use liquid or gas cooling, as will be described below. The integral cooling mechanism 180 permits the co-location of the control circuits and relays, without damaging either by inadequate cooling.

The testing device 110 may further include a network 160, coupled to a secondary controller 150. The secondary controller 150, for one embodiment, controls the probe used to test the DUT 140 on the test head 130. For one embodiment, the testing device 110 is designed to test a variety of integrated circuits. These devices under test (DUTs) 140 are placed in the testing device 110 and probed. For one embodiment, the bus 125 between the test head 130 and the computer system 120 is flexible and permits movement of the test head 130.

Figure 2:
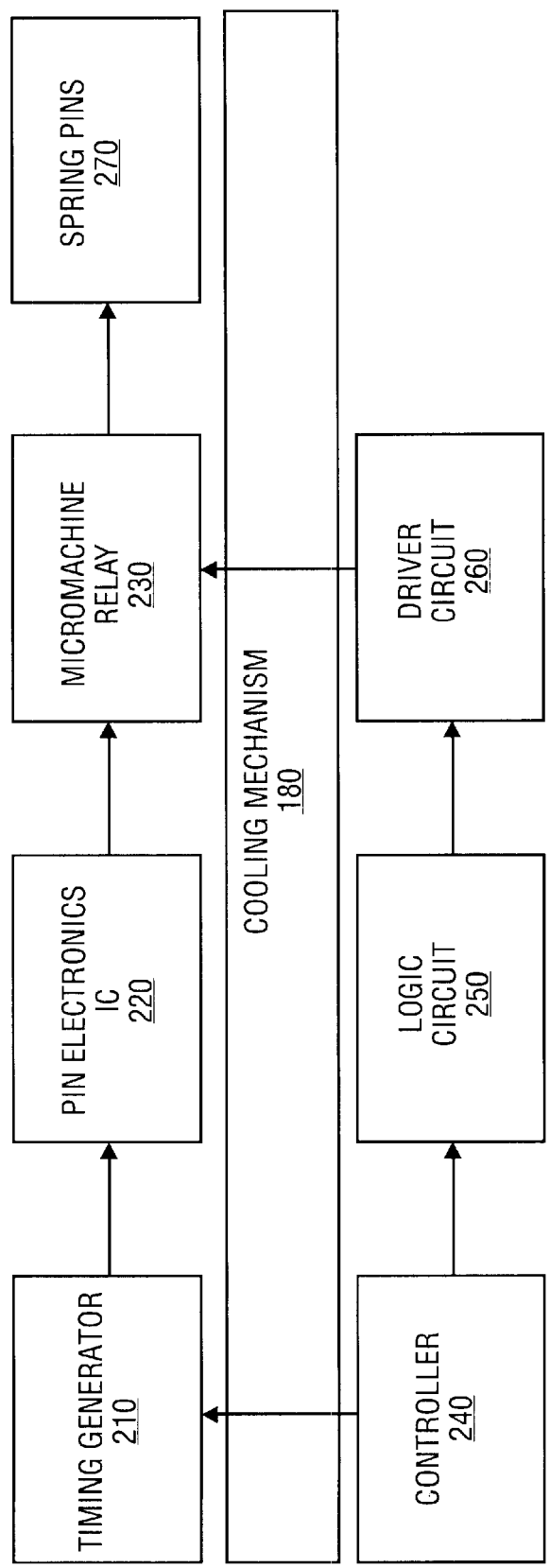
FIG. 2 illustrates a block diagram of one embodiment of a test head.

FIG. 2 is a block diagram of the circuitry included in the computer system 120 and test head 130. The timing generator 210 generates clocking/timing signals for the pin electronics IC (PEIC) 220. For one embodiment, the timing generator 210 is located in the computer system 120. Alternatively, the timing generator 210 may be moved to the test head 130, reducing signal delays. The PEIC 220 is located on the test head 130. The PEIC 220 is coupled to the micromachine relay 230, which is also located on the test head 130. The micromachine relay 230 controls the spring pins 270, located on the test head. The spring pins 270 interface with the device under test (DUT).

A controller 240 generates the signals used for testing the DUT. For one embodiment, the controller 240 is located on the computer system 120. A logic circuit 250 receives the signals from the controller 240. For one embodiment, the logic circuit 250 is located on the computer system 120. For an alternative embodiment, the logic circuit 250 is located on the test head 130. The logic circuit transmits some signals to a driver IC 260. For one embodiment, the logic circuit 250 is a field programmable gate array (FPGA).

A driver circuit 260 is coupled to the micromachine relay 230, and drives the micromachine relay 230.

The circuitry may further include cooling mechanism 180, to cool the test head. For one embodiment, the cooling mechanism is integral with the printed circuit board on which the PEIC 220 resides. For one embodiment, cooling mechanism is designed to receive and circulate a chilled substance that is used for cooling. The chilled substance may be a gas, such as R134, or a liquid, such as water. For one embodiment, the cooling mechanism 180 comprises cooling channels within the integrated circuit card. The cooling channels may be etched, drilled, cast, or micromachined, or created in some other way in the printed circuit board.

Figure 3:
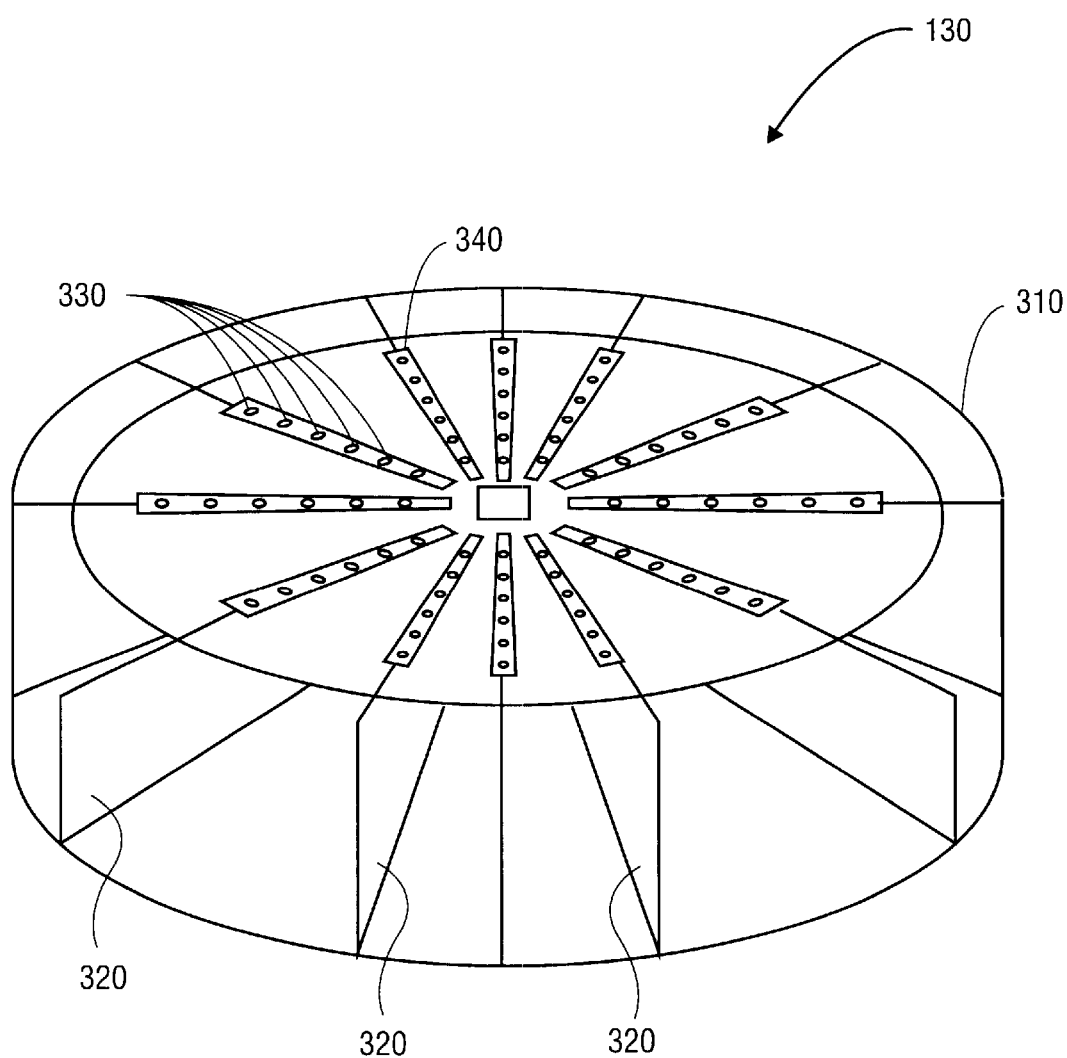
FIG. 3 illustrates a perspective view of one embodiment of a test head.

FIG. 3 illustrates one embodiment of the test head 130. For one embodiment, the test head 130 has a circular body 310. The test head 130 further includes a plurality of integrated circuit cards 320. The integrated circuit cards 130 are placed in a radial manner within the test head 130. The integrated circuit cards 310 are designed to control a plurality of pins 330 extending from each integrated circuit card 320. The pins 330 are designed to mate with the top of the test head 130, and thereby couple various signals to a device under test (DUT) 140. For one embodiment, the body of the test head 310 includes a plurality of wedge shaped cut-outs 340 on the top of the body 310. These wedge shaped cut-outs 340 are designed to receive a portion of the integrated circuit cards 320. The integrated circuit cards 320 are designed such that the portion containing the pins fit within the wedge shaped cut-outs 340. For anther embodiment, the top of the body 310 includes a plurality of holes 330 sized to fit the pins. The integrated circuit cards 320 are designed to have the pins 330 extend through the holes within the body 310. Alternative test head configurations may be used. But in any case, the test head includes a plurality of pins, arranged to connect a large number of pins to a single device under test coupled to the test head using the pins. For one embodiment, the pin density may be increased when using micromachine relays without increasing the wedge area, since pins may be placed more closely together.

Figure 4A:
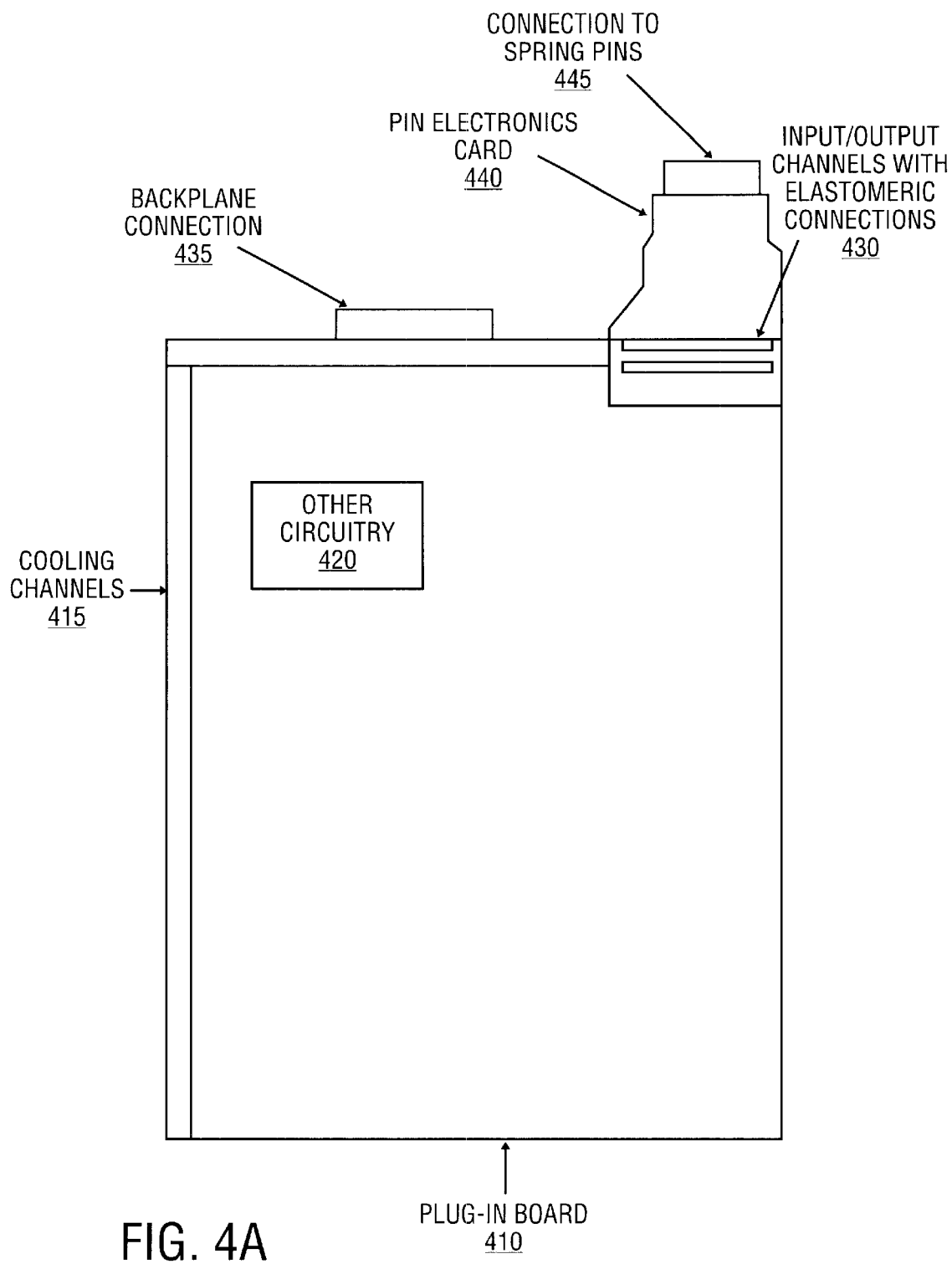
FIG. 4A illustrates a one embodiment of a control card.

FIG. 4A illustrates a layout of one embodiment of a circuit board. The plug-in board 410 is designed to be plugged into the test head 130. For one embodiment, in multiple plug-in boards 410 of similar configuration are plugged into a test head. For one embodiment, sixty-four plug-in boards 410 are plugged into a single test head. The plug-in board 410 includes cooling channels 415. Cooling channels 415 are designed to lead a cooling substance to pin electronics card 440, coupled to the plug-in board 410. For one embodiment, cooling channels 415 may further include stiffening material, to add rigidity to the plug-in board 410.

Other circuitry 420 may also be coupled to the plug-in board 410. Backplane connection 435 may couple plug-in board 410 to the back plane. The backplane (not shown) provides certain signals to the plug-in board 410, such as a ground and/or power signal. Other bussed signals may also be provided through the backplane.

The pin electronics card 440 is coupled to plug-in board. For one embodiment, the pin electronics card 440 includes input-output (I/O) channels 430. For one embodiment, the I/O connectors 430 are coupled to plug-in board 410 through elastomeric connections. The I/O connectors 430 lead signals from the plug-in board 410 to the circuitry on the pin electronics card 440 (not shown). The pin electronics card 440 includes the circuitry to control the connection to spring pins 445. The spring pins 445 (not shown) are used to couple various signals to a device under test.

The cooling channels 415 are connected through the pin electronics card 440, to provide a cooling mechanism for circuitry on the pin electronics card 440. This is described in more detail below.

Figure 4B:
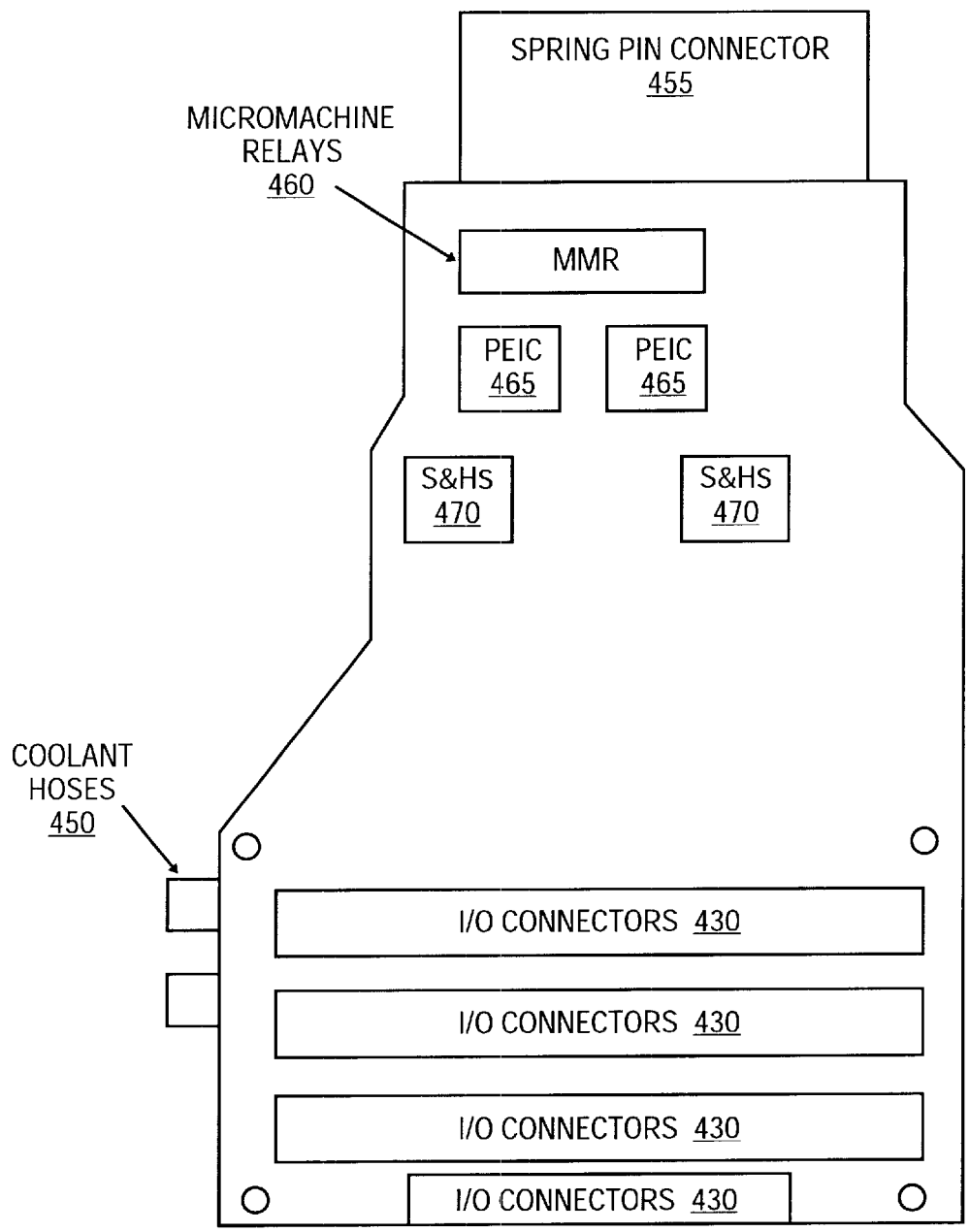
FIG. 4B illustrates a one embodiment of a pin electronics portion of the control card.

FIG. 4B illustrates a layout of one embodiment of the pin electronics card 440. The pin electronics card 440 includes I/O connectors 430. For one embodiment, each of the long I/O connectors shown corresponds to 120 I/O connections, while the short connector corresponds to 50 I/O connections. Thus, for one embodiment, up to 365 signals may be coupled to pin electronics circuit 440. Coolant hoses 460 lead coolant from the cooling channels 415 to the pin electronics card 440. The pin electronics card 440 may further include digital to analog converters (DACs). The DACs convert signals received from the test head into signals to control the micromachine relays 460 The pin electronics card 440 may further include sample and hold (S&H) circuits 470. An S&H circuit 470 provides a constant voltage output that provides an input to an A/D converter.

Pin electronics circuits (PEIC) 465 are for controlling the signals that the micromachine relays 460 couple to the pogo-pin connector 455. For one embodiment, a single micromachine relay controls each spring pin.

The spring pin, for another embodiment, may be an elastomeric connector, or a bump connector. The micromachine relay 460 controls the electrical connection between the spring pin and the pin electronics. For another embodiment, the spring pins may be mobile, and may be physically moved by the relay 460.

Thus, for example, a spring pin may have coupled to it, via PEIC 465 a signal A, and the micromachine relay 460, controlled by DAC, may couple the spring pin to a device under test (DUT) and thus couple the signal A to the DUT. In this way, testing of various devices may be accomplished using a test head having plug-in boards 410, including pin electronics cards 440.

Figure 4C:
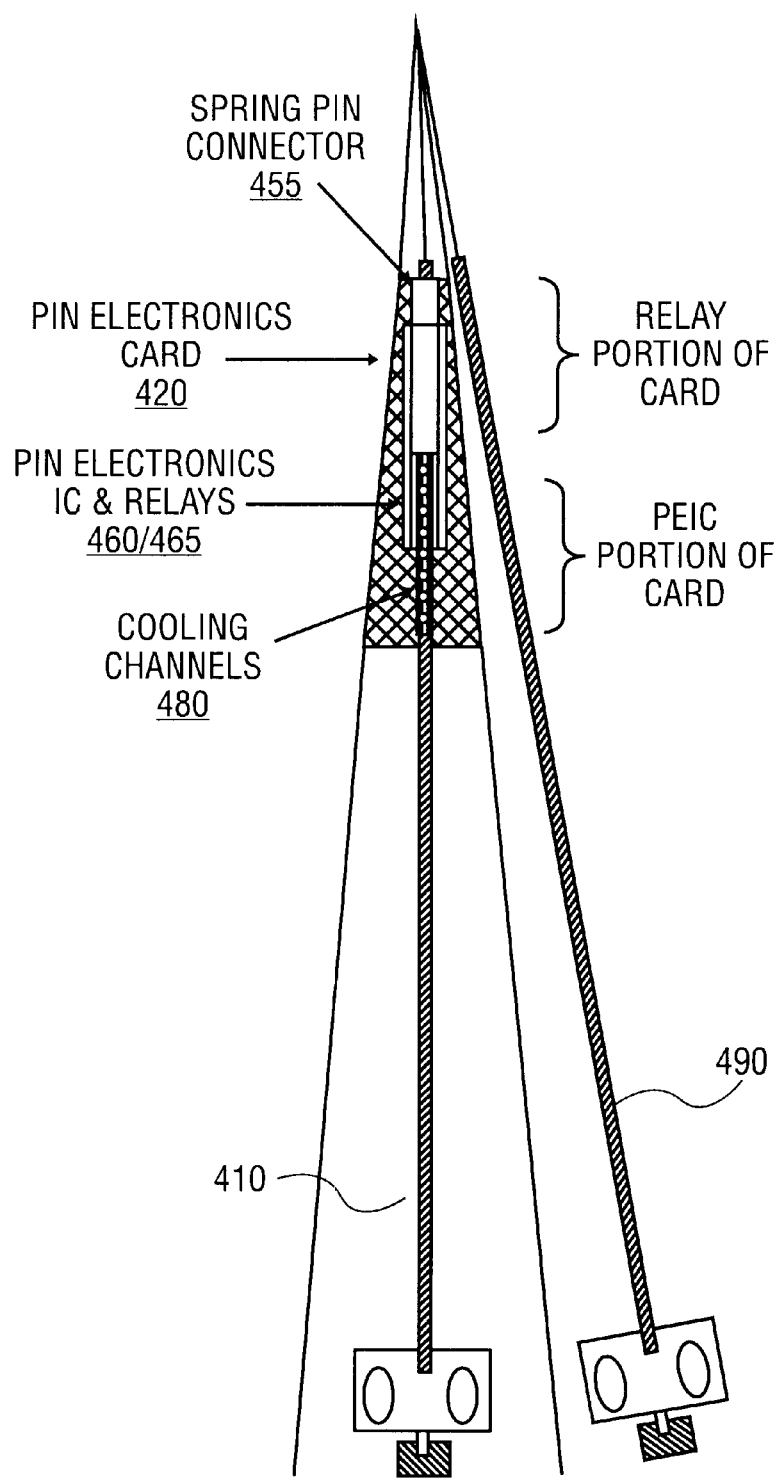
FIG. 4C illustrates one embodiment of a top view of the control card.

FIG. 4C illustrates one embodiment of the circuit board 410 from above, as it is in a test head. A single circuit board 410 is shown in detail, while an adjacent circuit board 490 is shown, to illustrate the relationship between the two boards.

The circuit board 410 includes pin electronics card 420. From above, the spring pin connector 455 can be seen as occupying a forward portion of the pin electronics card 420, and the extreme forward portion of the circuit board 410. For one embodiment, the spring pin connector 455 is positioned such that a DUT (not shown) would be located directly over the spring pin connector 455, such that by activating a spring pin, a connection to the DUT is established.

The pin electronics card 420 further includes PEICs and micromachine relays 460/465. These devices are coupled to the circuit board, as shown, and are located adjacent to as well as underneath the spring pin connector. As indicated, the forward portion of the pin electronics card 420 is the relay portion of the card, where the micromachine relays reside, while the rear portion of the pin electronics card 420 is the PEIC portion of the card, where the PEIC circuits reside.

Further, FIG. 4C shows one embodiment of cooling channels 480. Cooling channels are within the circuit board 410, and are designed to receive a cooling substance to provide cooling to the PEICs, DACs, micromachine relays, and other circuits on the card 420. For one embodiment, the cooling channels use water. Alternatively, HCFC, R134, xenon or another gas may be used. For one embodiment, the substance in the cooling channels 480 is circulated. For one embodiment, the material and location of the cooling channels 480 may be chosen to dissipate sufficient heat to maintain a device under test at a standard operating temperature, and to maintain the PEICs, DACs, and micromachine relays within their operating parameters. The adjustment of such cooling mechanisms is known in the art.

For one embodiment, cooling channel 480 may be micromachined. That is, micromachine devices may be used to form channels for the cooling substance. For another embodiment, cooling channel 480 may be etched into circuit board 410. Such methods of etching are known in the art. Alternatively, cooling channel 480 may be drilled into the board. For yet another embodiment, the circuit board 410 may be made including the cooling channels 480. For another embodiment, a heat sink may be cast and coupled to the pin electronics card 420, to cool the device. For one embodiment, such a heat sink may be located at the base of the circuit board 410. For one embodiment, such a heat sink may be integral with the coupling mechanism that couples the circuit board 410 to the test head.

Cooling channels 480, in any case, are integral with circuit board 410, and provides cooling for at least the pin electronics card portion 420 of the circuit board 410. For another embodiment, cooling channels 480 may extend through the entire circuit board 410, and may be used to cool other circuits on circuit board 410.

Figure 5:
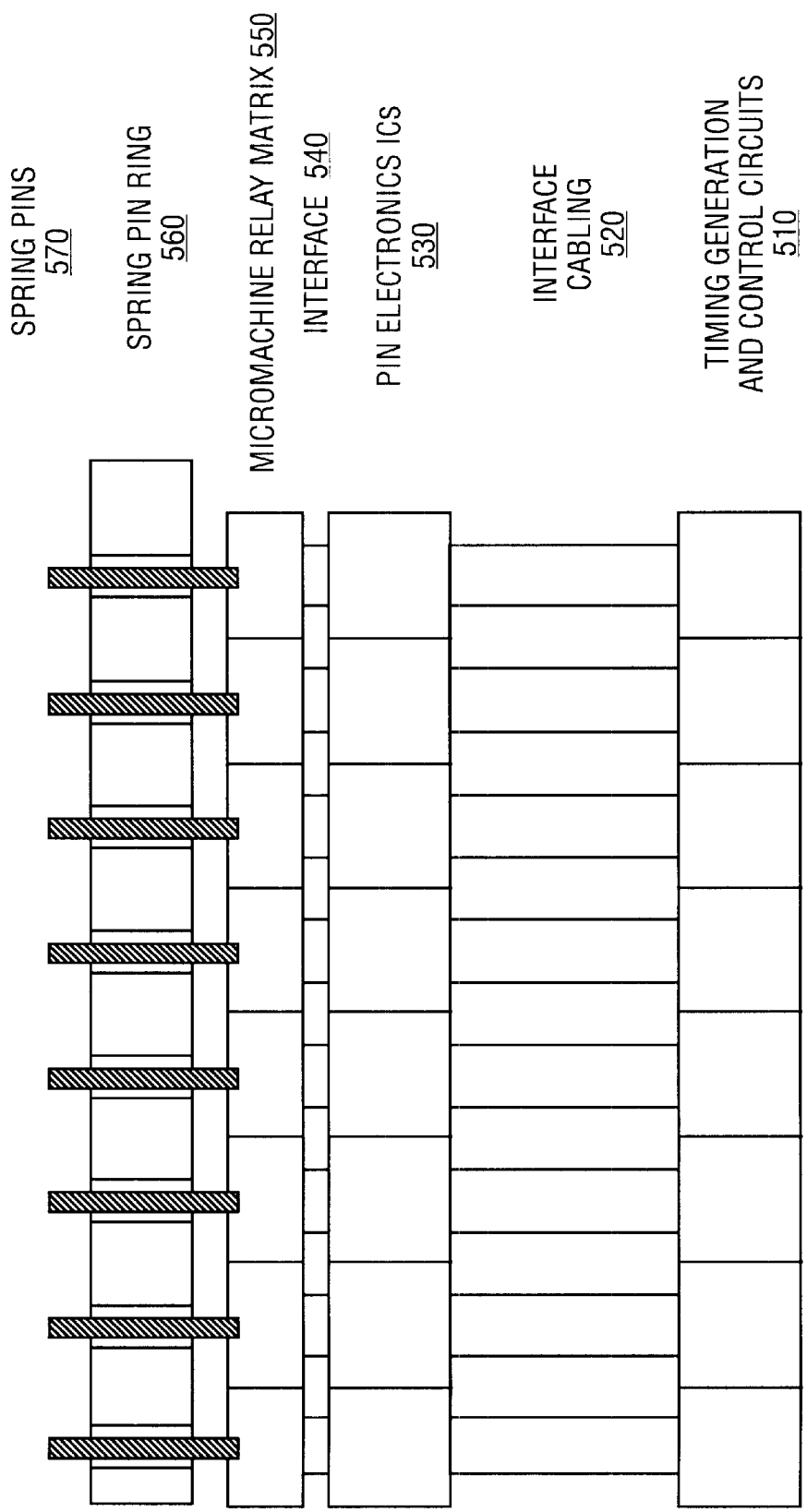
FIG. 5 illustrates one embodiment of the relationship between the elements of the control card

FIG. 5 illustrates a block diagram of a pin electronics card 320 of the present invention. The pin electronics card 320 or control card 320 is coupled to a spring pin ring 560. The spring pin ring 560 includes a plurality of spring pins 570 movably connected into the spring pin ring 560. The spring pin ring 560 is designed to keep the spring pins 570 in place while permitting motion. For one embodiment, each of the spring pins 570 is separately controlled. The spring pin ring 560 is wedge shaped for one embodiment. The wedge shaped spring pin ring 560 is designed to fit into the wedge shaped cut out 330 within the body of the test head 310.

A micromachine relay matrix (MRM) 550 is coupled to the spring pins 570. The micromachine relay switch matrix (MRM) 550 controls the connection of each of the spring pins 570. The MRM 550 is coupled to a pin electronics integrated circuit (PEIC) 530. The pin electronics integrated circuits (PEICs) 530 control the micromachine relay matrix 550. The PEIC 530 is coupled to the micromachine relay matrix (MRM) 550 via an interface 540. The PEIC 530 is designed to feed the control signals to the MRM 550, in order to control the spring pins 570. For one embodiment, the MRM 550 is implemented on the same substrate as the PEIC 530, and the interface 540 comprises traces on a printed circuit board. For another embodiment, the MRM 550 and the PEIC 530 together form a hybrid device.

Timing generation and control circuits 510 are located at the bottom of the block diagram. For one embodiment, the timing generation and control circuits 510 are located within the computer system 120. For another embodiment, the timing generation and control circuits 510 are included within the test head 130. The timing generation and control circuits 510 generates testing and motion signals for the spring pins 570 and test head 130. The timing generation and control circuits 510 are connected via interface cabling 520 to the pin electronics integrated circuits (PEIC) 530. For one embodiment, the interface cabling 520 is a bus designed to reduce deterioration of the timing and control signals generated by the timing generation and control circuits 510. For one embodiment, the length of the interface cabling 520 is kept to a minimum. By reducing the size of the relays by using micromachine relays, the timing generating and control circuits 510 may, for one embodiment, be placed on the test head, thereby reducing the length of interface cabling 520.

Figure 6:
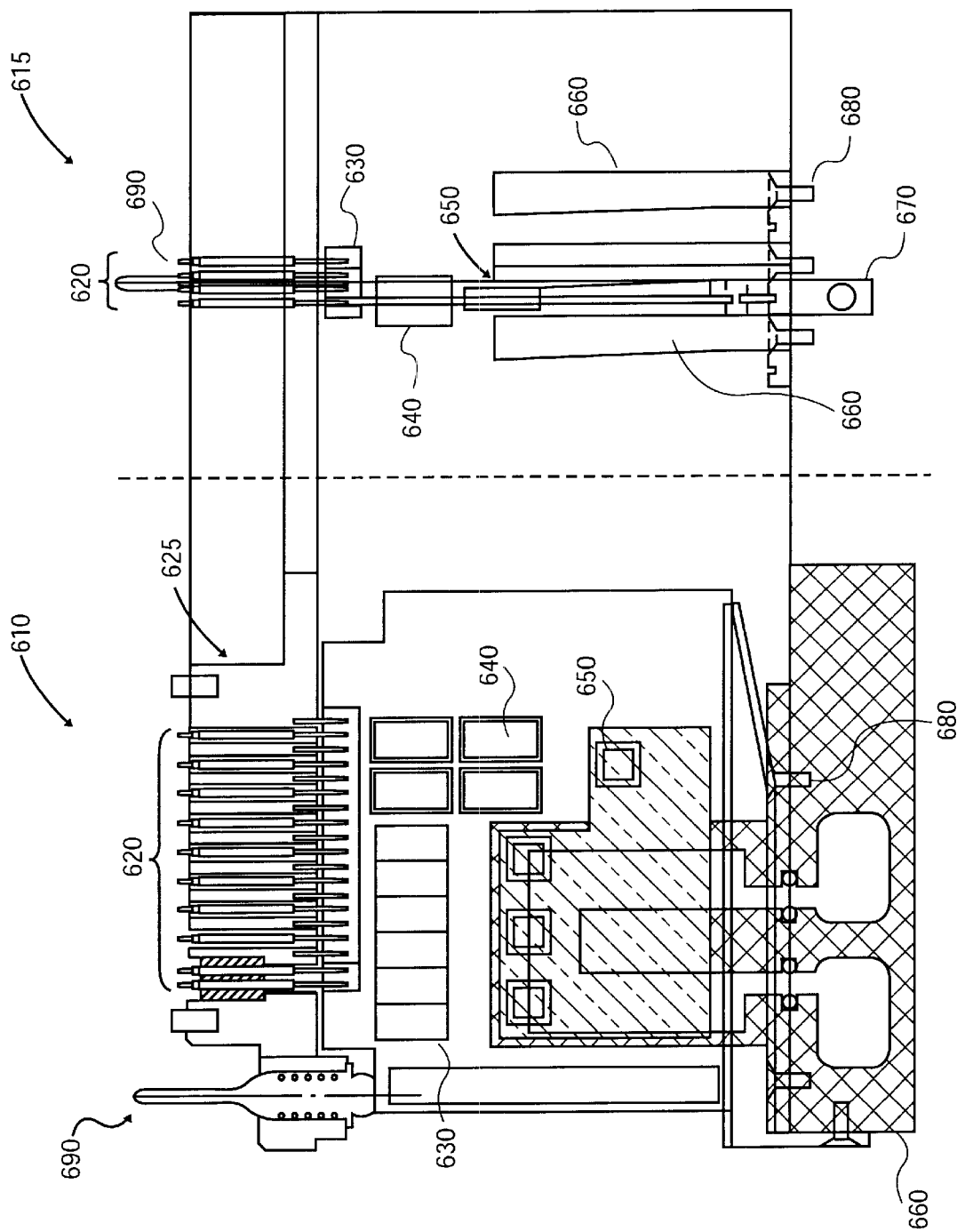
FIG. 6 illustrates a detailed diagram of one embodiment of a control card of the present invention.

FIG. 6 illustrates a detailed diagram of one embodiment of a control card 320 of the present invention. FIGS. 6 includes a side view 610 of a control card 320, as well as a front view 615. A plurality of pins 620 are shown extending from the control card 320. The structure supporting the pins 620 is the spring pin ring 625.

The micromachine relays 630 are coupled to the pins 620. The micromachine relays 630 control the motion of the pins 620 within the spring pin ring 625. A plurality of integrated circuits 640 are further coupled to the card. The integrated circuits include the pin electronics IC, and other integrated circuits.

For one embodiment, a cooling manifold is coupled to the control card. The cooling manifold 660 is used to cool certain integrated circuits. For one embodiment, some of the pin electronics ICs are in contact with the cooling manifold. For an alternative embodiment, heat sinks are coupled to the integrated circuits, and the heat sinks are coupled to the cooling manifold 660. For one embodiment, the cooling manifold 660 is a metal element having a path for a cooling fluid, such as water. In an alternative embodiment, other cooling mechanisms may be used.

Figure 7:
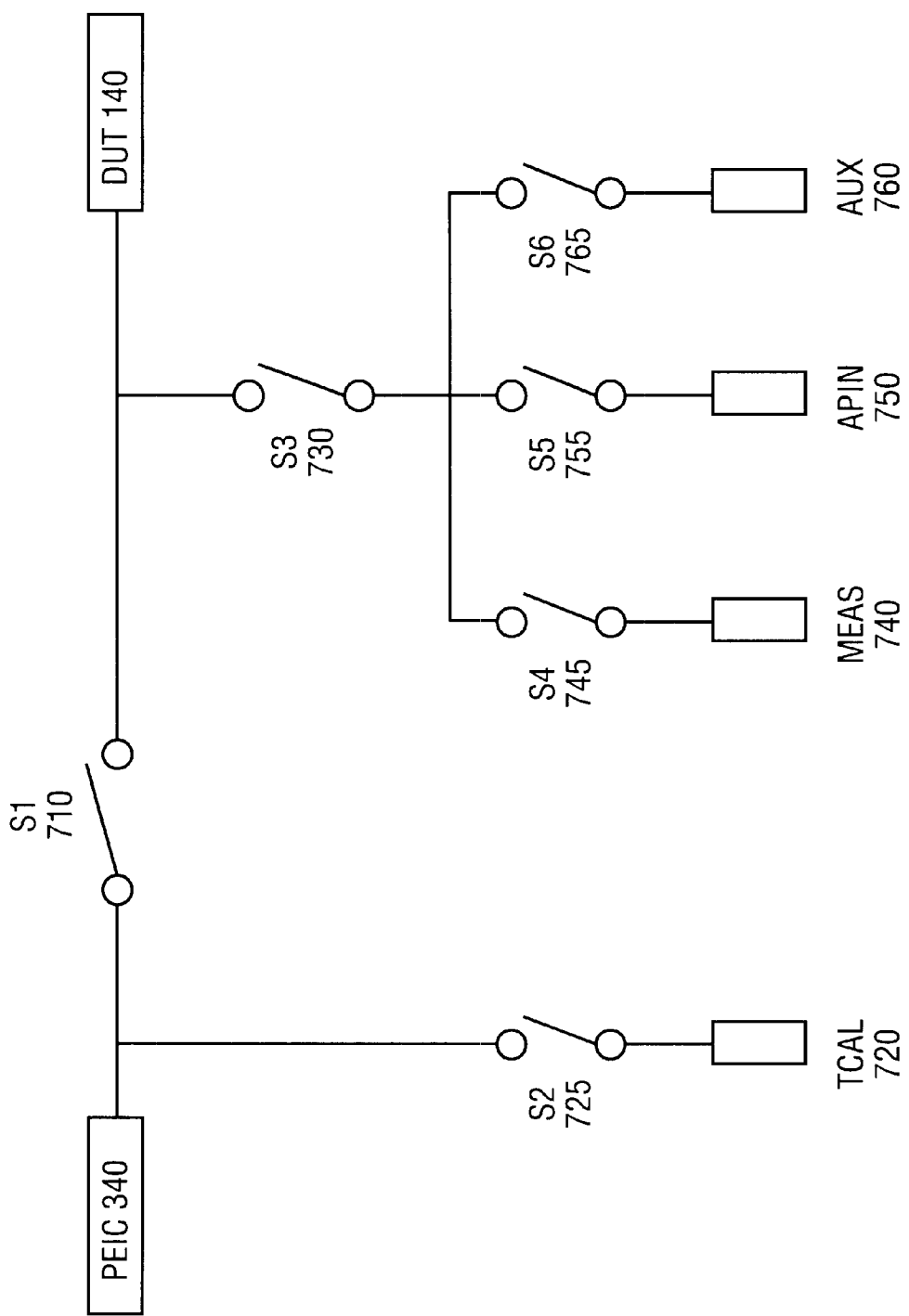
FIG. 7 illustrates one embodiment of the switching setup of a micromachine relay of the present invention.

FIG. 7 illustrates one embodiment of the switching setup of a micromachine relay of the present invention. The micromachine relay comprises a plurality of switches which switch in or out a plurality of signal sources. For one embodiment, the pin electronics IC 430 is coupled to the device under test (DUT) 140 via a first switch S1 710. When the first switch S1 710 is closed, the PEIC 430 is coupled to the DUT 140. A timing calibration input (TCAL) 720 is coupled between the PEIC 430 and DUT 140 via second switch S2 725. Additionally, another plurality of signals 740, 750, and 760 are coupled to between the PEIC 430 and DUT 140 via a third switch 730. For one embodiment, these plurality of signals may include a measure of DC power (MEAS) 740, an analog resource (APIN) 750, and an auxiliary path (AUX) 760. For one embodiment, the auxiliary path 760 comprise a high quality radio frequency grade path. The signals MEAS 740, APIN 750, and AUX 760 are coupled to the third switch S3 via a fourth S4 745, fifth S5 755, and sixth S6 765 pin respectively.

Figure 8:
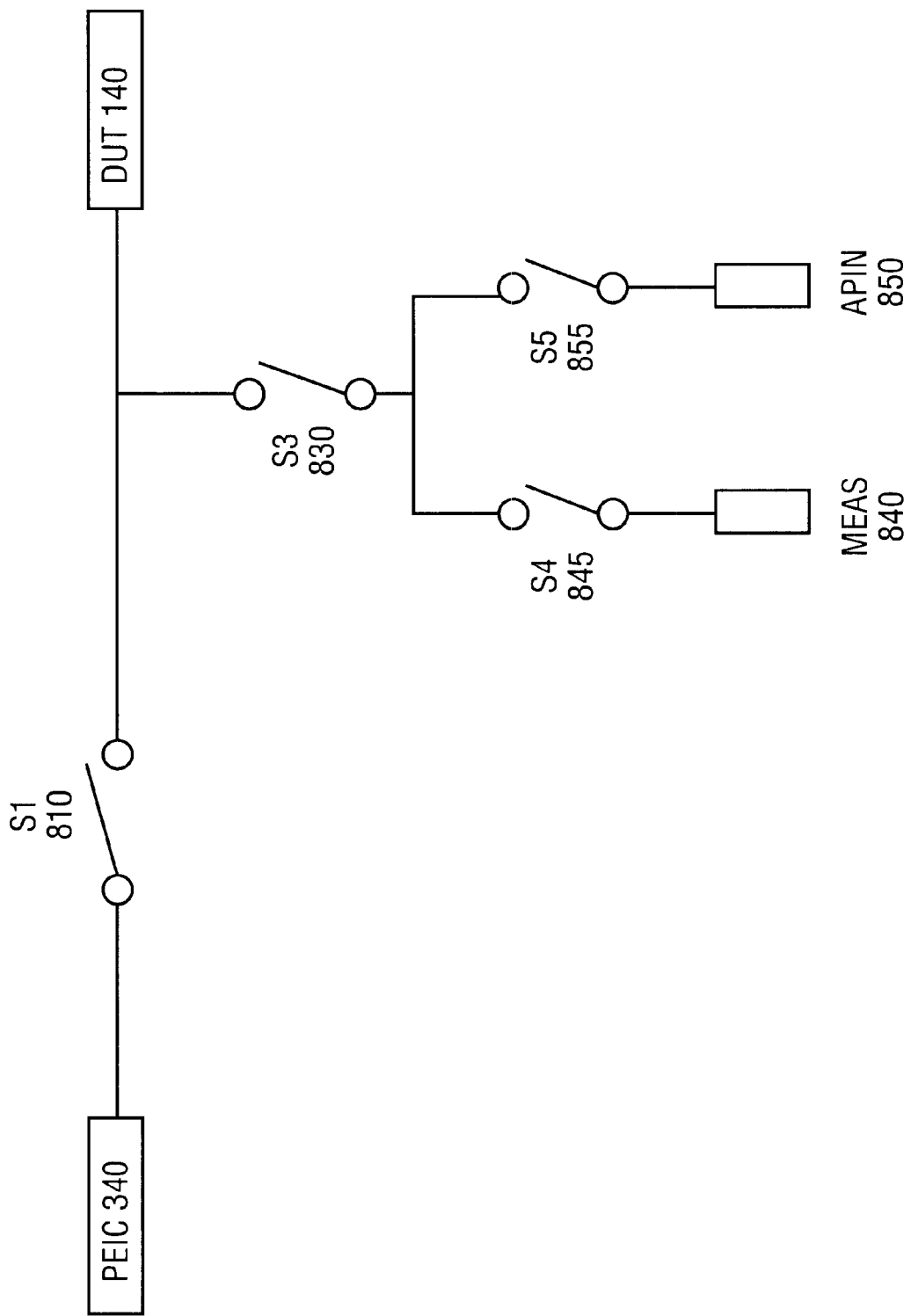
FIG. 8 illustrates another embodiment of the switching setup of a micromachine relay of the present invention.

FIG. 8 illustrates an alternative embodiment of the switching setup of a micromachine relay of the present invention. The PEIC 440 is coupled to the DUT 140 via a first switch S1 810. A plurality of signals 840, and 860 are coupled to between the PEIC 430 and DUT 130 via a third switch 830. For one embodiment, these plurality of signals may include a measure of DC power (MEAS) 840 and an analog resource (APIN) 850.

Figure 9A:
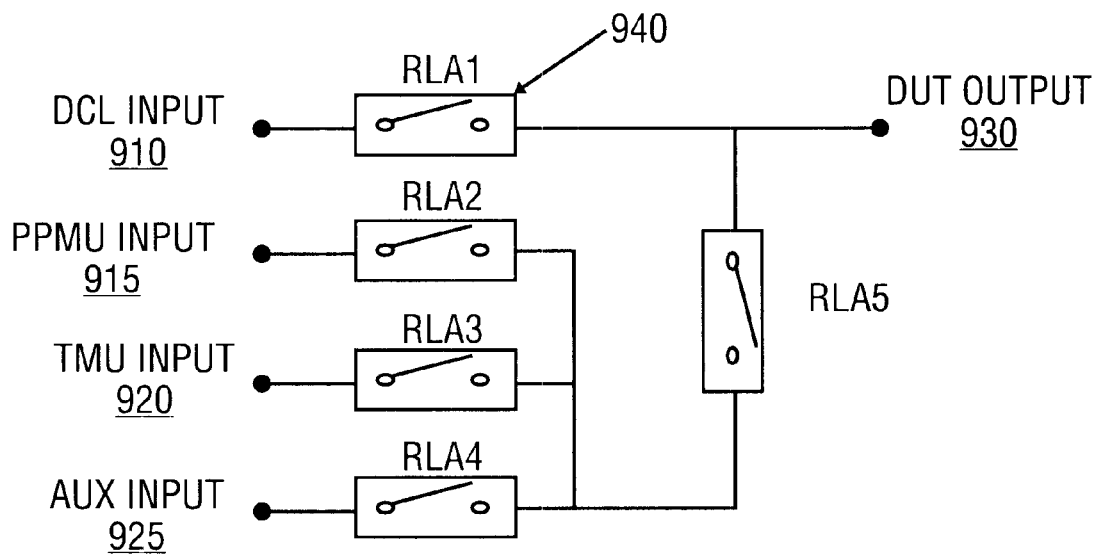
FIG. 9A illustrates one embodiment of one stage of a micromachine relay.

FIG. 9A illustrates one embodiment of one stage of a micromachine relay. For one embodiment, eight identical stages comprise the micromachine chip. For one embodiment, the eight independent stages, include 20 relays. In the stage shown in FIG. 9A, relays 1–5, designated RLA1 through RLA5, are shown as switches 940. Relays actually control movement of the signal to a device under test, shown as DUT output 930. The inputs to the stage shown include DCL input 910, PPMU input 915, TMU input 920, and AUX input 925. DCL input 910 is from the pin electronics hybrid (PEHB). PPMU input 915 is from a pin parametric measurement unit, which is used to make low speed analog measurements, and DC voltage/current measurements. TMU input 920 is a time measurement unit input, and used to measure time response. AUX input 925 is used to make auxiliary measurements.

One set of specifications, derived from an exemplary implementation of the above circuit provides the following exemplary specification numbers:

Actuator voltage/current (contacts closed): +2.0 to +5.5 Volts, <25 mA; or 50V at <1 mA for electrostatic systems Switching characteristics of open/close settling time: <100 μs

MTFB: 4 δ

For one embodiment, the specification met after 100 million switch operations should be:

Capacitance between open contacts: <25 fF

Capacitance between contacts and actuator: <50 fF

Crosstalk between stages: <20 dB at 5 GHz

Crosstalk between DCL and AUX when relays are open: <20 dB at 5 GHz

Note that these numbers are design targets and may be varied during implementation. Furthermore, using the above defined circuit, the following target relationship data was obtained:

Setup: RLA1 ON, RLA2, RLA3, RLA4, RLA5 OFF (DC to 5 GHz)

Nominal impedance: 50 ohms;

VSWR: 1.2:1

Insertion loss: <0.1 dB

Voltage/current handling capability: >+/=100 V, 100 mA
Setup: RLA4 and RLA5 ON, RLA1, RLA2, RLA3 OFF (DC to 1 GHz)

Nominal impedance: 50 ohms;

VSWR: 1.2:1

Insertion loss: <0.1 dB

Voltage/current handling capability: >+/=100 V, 100 mA
Setup: RLA3 and RLA5 (or RLA 2 and RLA 5) ON, RLA1, RLA4 OFF (DC to 5 GHz)

DC ON resistance: <100 mΩ

Cold-switch handling capability: +/-100 V, 500 mA

Figure 9B:
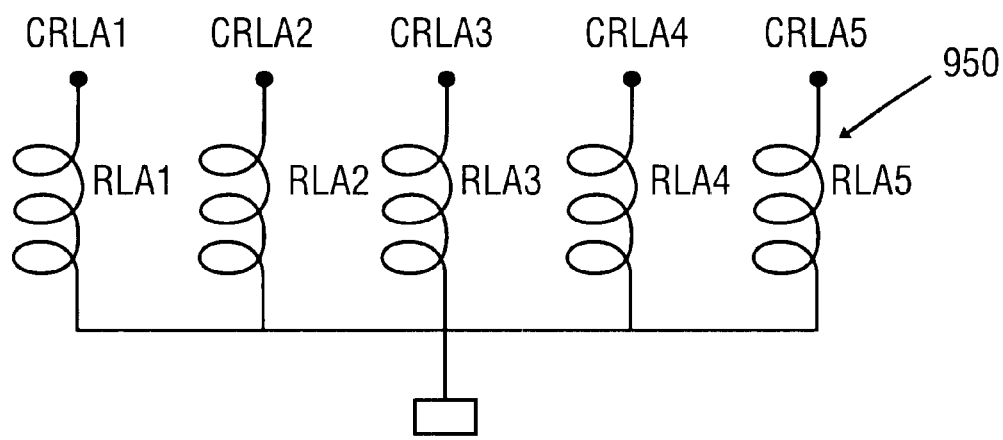
FIG. 9B illustrates a circuit diagram of one embodiment of the micromachine relay.

FIG. 9B illustrates a circuit diagram of one embodiment of the micromachine relay. The relays are illustrated as resistors, showing the effect of the relays on signals being passed to the DUT.

Figure 9C:
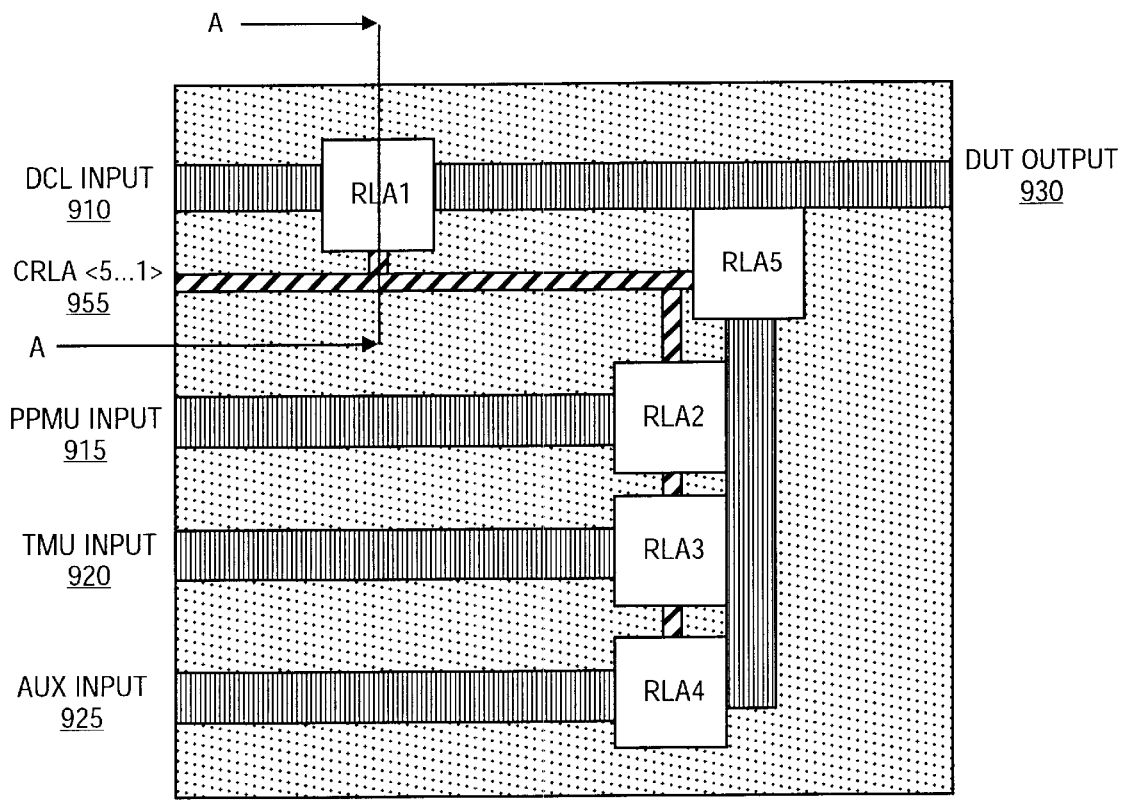
FIG. 9C illustrates a physical layout path of one embodiment of one stage of the micromachine relay.
Figure 9D:
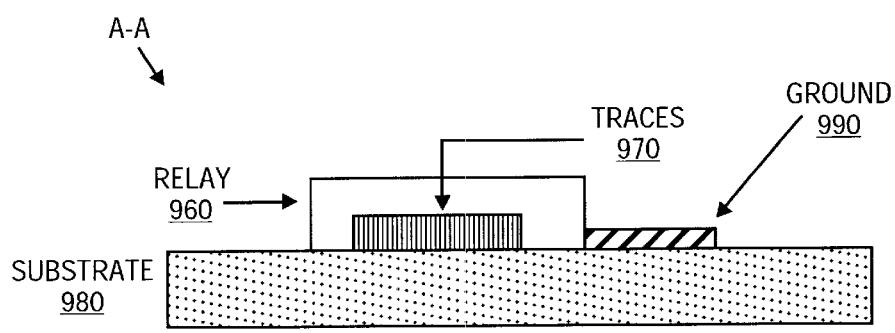
FIG. 9D illustrates a cross-section of the physical layout of FIG. 9C.

FIG. 9C illustrates a physical layout path of one embodiment of one stage of the micromachine relay. The relays RLA1 through RLA5 are shown on a substrate, each having an input signal on a trace. The CRLA signal 955 is coupled to all of the RLAs. As FIG. 9D shows, relays 960 are placed on substrate 980. Traces 970 couple the appropriate primary signal to each of the relays 960. Ground 990 is further coupled to relay 960. FIGS. 9C and 9D illustrate an exemplary circuit layout of a micromachine relay, as shown in FIG. 9A. It is to be understood that alternative layouts may be used.

The micromachine relays illustrated as switches may be implemented in a variety of ways. For one embodiment, a cantilever arm is designed, and the motion of the cantilever arm is controlled by electromagnetic attraction/repulsion. For another embodiment, disk drive technology may be used to implement the micromachine relays, using rhodium contacts and ferrite electromagnets. For another embodiment, a relay may be implemented using micromachined parts. For another embodiment, an electrostatic relay may be used. Alternatively, other implementations of the micromachine relay may be used.

Figure 10A:
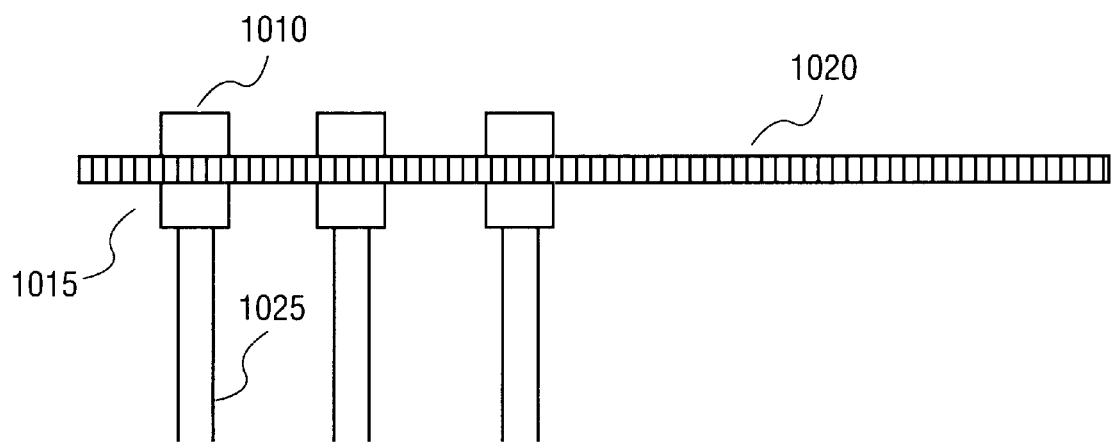
FIG. 10A illustrates one embodiment of a set of spring pins implemented as an elastomeric connection.

FIG. 10A illustrates one embodiment of a set of spring pins implemented as an elastomeric connection. The pins 1010 are designed to be coupled to a device under test. Each pin 1010 has a counterpart 1015, which is located beneath the pin 1010, and coupled to the pin via elastomeric material 1020. Elastomeric materials 1020 include a plurality of small conductive wires. For one embodiment, elastomeric material 1020 includes vertical connections only, coupling counterpart 1015 to pin 1010, when the actuator 1025 compresses the elastomeric material 1020. The actuator 1025 is controlled by the micromachine relays.

Figure 10B:
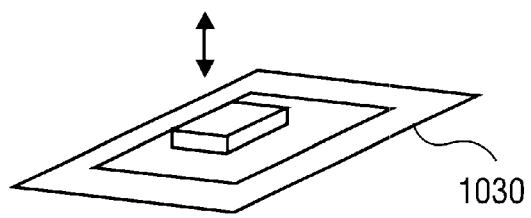
FIG. 10B illustrates one embodiment of a spring pin implemented as a micromachined bump connector.
Figure 10C:
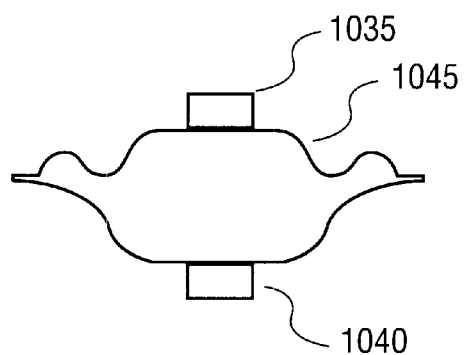
FIG. 10C illustrates another embodiment of a spring pin implemented as a micromachined bump connector.

FIG. 10B illustrates one embodiment of a spring pin implemented as a micromachined bump connector. The spring pin 1030 is moved by electrostatic force, to couple the conductive layer 1030 to the device under test. In this system, either the pin may be rigid, and a conductor may be coupled to the pin, or the pin may itself move, and be physically coupled to and decoupled from the device. The alternative embodiment of FIG. 10C shows the pin 1035 being rigid, while a flexible coupling mechanism 1045 moves up and down, to electrically couple the pin 1035 to the device under test.

Figure 10D:
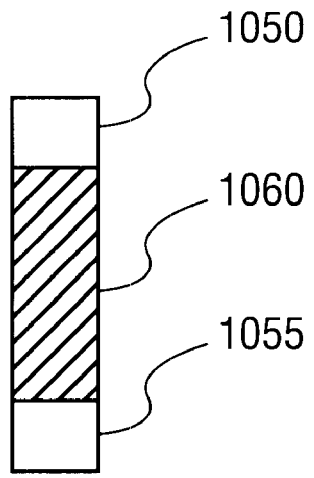
FIG. 10D illustrates one embodiment of a spring pin implemented as a liquid-based system.

FIG. 10D illustrates one embodiment of a spring pin implemented as a liquid-based system. The pin 1050 is rigid, and has a counterpart 1055. The area between the pin 1050 and its counterpart 1055 is bridged by a material 1060 which may be made to expand to cause an electrical connection. Thus, for example, a liquid may be used, which is expanded by micromachined relays, to establish a connection. Alternative materials may be used if they are responsive to a signal to expand and contract.

The implementations of spring pins for use with micromachine relays discussed in FIGS. 10A–D are merely exemplary. It is to be understood that alternative methods of establishing an electrical connection between a device under test and a pin electronics circuit may be used.

The use of the micromachine relays results in many benefits, including a reduced electrical length, by permitting the mounting of the relays and the hybrid circuits close to the spring pins. Furthermore, the use of micromachine relays increases bandwidth by reducing capacitance, using short PCB traces and bales. Furthermore, the use of the micromachine relays increases pin count and decreases the space necessary for a pin electronics card. These advantages are the result of using the micromachine relays described above.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense. The present invention should not be construed as limited by such embodiments and examples, but rather construed according to the following claims.

What is claimed is:

1. An integrated circuit card for a test head, the integrated circuit card comprising:
    an input/output (I/O) channel with an elastomeric connector;
    pin electronics integrated circuit (PEIC) coupled to the I/O channel;
    micromachine relays coupled to the PEIC;
    spring pins coupled to and controlled by the micromachine relays, the spring pins designed to be movably coupled to a device under test (DUT);
    a heat sink structure integral to the integrated circuit card to flow a chilled substance through the heat sink structure to cool the PEICs.

2. The integrated circuit card of claim 1, wherein the chilled substance comprises a gas or a liquid.

3. The integrated circuit card of claim 1, wherein the heat sink structure comprises cooling channels within the integrated circuit card.

4. The integrated circuit card of claim 1, wherein the cooling channels are etched, drilled, cast, or micromachined within the integrated circuit card.

5. The integrated circuit card of claim 1, further comprising a driver circuit for driving a movement of each of the micromachine relays.

6. The integrated circuit card of claim 1, wherein the integrated circuit card further includes a timing generator for generating clocking and timing signals for the PEIC.

7. The integrated circuit card 6, wherein the timing generator is located on the test head, thereby reducing signal delays.

8. The integrated circuit card of claim 1, further comprising a tester for generating the signals used to test the DUT.

9. The integrated circuit card of claim 8, further comprising a logic circuit receiving signals from the tester.

10. The integrated circuit card of claim 9, wherein the logic circuit is located on the test head.

11. The integrated circuit card of claim 9, wherein the logic circuit is a field programmable gate array (FPGA).

12. A circuit card for a test head, the circuit card comprising:
    an input/output channel with a connector;
    a pin electronics integrated circuit (PEIC) coupled to the input/output channel;
    micromachine relays coupled to the PEIC;
    spring pins coupled to and controlled by the micromachine relays, the spring pins designed to be movably coupled to a device under test (DUT).

13. The circuit card of claim 12, further comprising a driver circuit for driving movements of the micromachine relays.

14. The circuit card of claim 12, wherein the circuit card further includes a timing generator for generating clocking and timing signals for the PEIC.

15. The circuit card of claim 14, wherein the timing generator is located on the test head, thereby reducing signal delays.

16. The circuit card of claim 12, further comprising a tester for generating the signals used to test the DUT.

17. The circuit card of claim 16, further comprising a logic circuit receiving signals from the tester.

18. The circuit card of claim 17, wherein the logic circuit is located on the test head.

19. The circuit card of claim 17, wherein the logic circuit is a field programmable gate array (FPGA).

20. A circuit card for a test head, the circuit card comprising:
    input/output means with connector means;
    pin electronics means coupled to the input/output means;
    micromachine relay means coupled to the pin electronics means;
    spring means controlled by the micromachine relay means for movable coupling to a device under test.

21. The circuit card of claim 20, further comprising means for driving movement of the micromachine relay means.

22. The circuit card of claim 20, further comprising means for generating clocking and timing signals for the pin electronics means.

23. The circuit card of claim 20, further comprising means for generating signals for testing the device under test.

* * * * *